US010586749B2

(12) United States Patent
Li et al.

(10) Patent No.: US 10,586,749 B2
(45) Date of Patent: Mar. 10, 2020

(54) HIGH POWER GALLIUM NITRIDE DEVICES AND STRUCTURES

(71) Applicants: Zhanming Li, West Vancouver (CA); Yue Fu, Coquitlam (CA); Wai Tung Ng, Thornhill (CA); Yan-Fei Liu, Kingston (CA)

(72) Inventors: Zhanming Li, West Vancouver (CA); Yue Fu, Coquitlam (CA); Wai Tung Ng, Thornhill (CA); Yan-Fei Liu, Kingston (CA)

( * ) Notice: Subject to any disclaimer, the term of this patent is extended or adjusted under 35 U.S.C. 154(b) by 0 days.

(21) Appl. No.: 15/960,508

(22) Filed: Apr. 23, 2018

(65) Prior Publication Data

US 2018/0247879 A1 Aug. 30, 2018

Related U.S. Application Data

(63) Continuation of application No. 15/859,502, filed on Dec. 30, 2017.

(Continued)

(51) Int. Cl.
*H01L 23/367* (2006.01)
*H01L 23/498* (2006.01)
(Continued)

(52) U.S. Cl.
CPC ...... *H01L 23/367* (2013.01); *H01L 23/49844* (2013.01); *H01L 23/5386* (2013.01); *H01L 24/05* (2013.01); *H01L 24/06* (2013.01); *H01L 24/14* (2013.01); *H01L 25/071* (2013.01); *H01L 25/072* (2013.01); *H01L 25/18* (2013.01); *H01L 29/0696* (2013.01);
*H01L 29/2003* (2013.01); *H01L 29/41758* (2013.01); *H01L 24/13* (2013.01); *H01L 24/16* (2013.01); *H01L 29/42316* (2013.01); *H01L 29/778* (2013.01); *H01L 29/7787* (2013.01); *H01L 2224/05552* (2013.01); *H01L 2224/06135* (2013.01); *H01L 2224/06179* (2013.01); *H01L 2224/13101* (2013.01); *H01L 2224/14135* (2013.01);
(Continued)

(58) Field of Classification Search
CPC ............ H01L 23/367; H01L 23/49844; H01L 23/5386; H01L 24/06; H01L 29/41758
See application file for complete search history.

(56) References Cited

U.S. PATENT DOCUMENTS

2003/0218176 A1* 11/2003 Zhao ...................... H01L 33/38
257/81
2011/0089442 A1* 4/2011 Jing .................... H01L 25/0753
257/91
(Continued)

*Primary Examiner* — Christine A Enad

(57) ABSTRACT

Described herein are semiconductor devices and structures with improved power handling and heat dissipation. Embodiments are suitable for implementation in gallium nitride. Devices may be provided as individual square or diamond-shaped dies having electrode terminals at the die corners, tapered electrode bases, and interdigitated electrode fingers. Device matrix structures include a plurality of device dies arranged on a substrate in a matrix configuration with interdigitated conductors. Device lattice structures are based on a unit cell comprising a plurality of individual devices, the unit cells disposed on a chip with geometric periodicity. Also described herein are methods for implementing the semiconductor devices and structures.

19 Claims, 14 Drawing Sheets

Related U.S. Application Data

(60) Provisional application No. 62/451,692, filed on Jan. 28, 2017, provisional application No. 62/457,874, filed on Feb. 11, 2017.

(51) Int. Cl.
| | |
|---|---|
| *H01L 23/538* | (2006.01) |
| *H01L 29/417* | (2006.01) |
| *H01L 29/06* | (2006.01) |
| *H01L 23/00* | (2006.01) |
| *H01L 25/07* | (2006.01) |
| *H01L 25/18* | (2006.01) |
| *H01L 29/20* | (2006.01) |
| *H01L 29/778* | (2006.01) |
| *H01L 29/423* | (2006.01) |

(52) U.S. Cl.
CPC ........... *H01L 2224/16225* (2013.01); *H01L 2224/16227* (2013.01); *H01L 2924/1015* (2013.01); *H01L 2924/1016* (2013.01); *H01L 2924/1033* (2013.01); *H01L 2924/10156* (2013.01); *H01L 2924/10162* (2013.01); *H01L 2924/10253* (2013.01); *H01L 2924/1203* (2013.01); *H01L 2924/1306* (2013.01); *H01L 2924/13064* (2013.01); *H01L 2924/13091* (2013.01)

(56) References Cited

U.S. PATENT DOCUMENTS

| | | | |
|---|---|---|---|
| 2011/0114966 A1* | 5/2011 | Liu | H01L 33/38 257/76 |
| 2012/0168979 A1* | 7/2012 | Bauer | B28B 1/004 264/141 |

* cited by examiner

HIGH POWER GALLIUM NITRIDE DEVICES AND STRUCTURES

RELATED APPLICATIONS

This application is a continuation of application Ser. No. 15/859,502, filed Dec. 30, 2017, and claims the benefit of the filing date of Application No. 62/451,692, filed Jan. 28, 2017, and Application No. 62/457,874, filed Feb. 11, 2017, the contents of which are incorporated herein by reference in their entirety.

FIELD

The invention relates to power semiconductor devices. More particularly, the invention relates to power gallium nitride devices and structures with improved power handling characteristics.

BACKGROUND

Gallium nitride (GaN) based power devices have been regarded as promising candidates for high-frequency and high-power applications owing to the superior material properties such as high polarization-induced 2DEG density, high electron saturation velocity and high critical breakdown electric field. By using GaN instead of silicon, system efficiency can be boosted and also a smaller system volume can be achieved. Despite these advantages, self-heating has been a major hindrance to the deployment of AlGaN/GaN HEMTs in RF/microwave and power electronics applications. The small area occupied by this class of semiconductor chips results in a need to dissipate the heat uniformly and efficiently.

GaN based high electron mobility transistors (HEMTs) are naturally depletion mode (D-mode) devices, which means that when there is no control signal on the gate terminal, the conducting channel is normally on. The on-state resistance of GaN power devices strongly depends on geometry of the layout design.

To deal with this problem, a low voltage silicon MOSFET is usually series-connected with a D-mode HEMT to create a hybrid E-mode device. A prior approach using multiple dies and devices included a series connection of an E-mode HEMT with a D-mode HEMT and a series connection of a silicon MOSFET with a GaN HEMT. However, in such multiple device or multiple die configurations, heat dissipation efficiency was unfavorable.

In addition, prior layout topologies lacked scalability and uniformity on the bare die level when flip-chip packaged on a PCB with good heat dissipation capability such as metal or ceramic based PCB.

SUMMARY

According to one aspect of the invention there is provided a semiconductor device, comprising: a die having four sides and four corners, wherein first and second corners are opposed and third and fourth corners are opposed; first and second electrodes disposed on the die at locations corresponding respectively to the first and second corners, each of the first and second electrodes having a bonding pad, a tapered base, and a plurality of electrode fingers extending from the tapered base; wherein the bonding pad of each of the first and second electrodes is located at a respective first and second corner of the die; wherein the tapered base of each of the first and second electrodes decreases in width in both directions away from its respective corner of the die; wherein the plurality of electrode fingers of the first and second electrodes are interdigitated; and a conductive channel between the interdigitated electrode fingers of the first and second electrodes. The semiconductor device may be a GaN semiconductor device.

In one embodiment, the die is diamond-shaped. In another embodiment, the die is square-shaped.

In one embodiment, the electrode fingers of the first and second electrodes are oriented parallel to an axis defined by the first and second corners of the die.

In one embodiment, the electrode fingers are of varying length, the length of the electrode fingers decreasing along the tapered electrodes in both directions away from their respective corners of the die.

In one embodiment, each finger of the plurality of electrode fingers has a base where it extends from an electrode and a tip, and each finger is wider at the base than at the tip.

In one embodiment, the semiconductor device is a diode, wherein the first and second electrodes are an anode and a cathode of a GaN diode.

In one embodiment, the conductive channel is electrically connected to at least one of a third electrode and a fourth electrode; wherein the third and fourth electrodes are disposed on the die at locations corresponding respectively to the third and fourth corners of the die. In one embodiment, the semiconductor device is a GaN FET or a GaN HEMT, the first and second electrodes are a drain and a source, and at least one of the third and fourth electrodes is a gate electrode.

According to another aspect of the invention there is provided a semiconductor device matrix, comprising: a circuit board; a plurality of conductors disposed on at least one side of the circuit board as interdigitated conductors; at least one electrical connection point associated with each of the plurality of conductors; a plurality of identical or similar semiconductor dies according to claim 1, the dies being arranged in a matrix comprising n rows×m columns, where n and m are non-zero integers; the plurality of dies being mounted on the circuit board with electrical connections between the electrodes of the dies and the interdigitated conductors of the circuit board; wherein the interdigitated conductors conduct electrical current to and from each of the dies.

In one embodiment of the semiconductor device matrix, the plurality of identical or similar semiconductor dies comprise diodes, FETs, or HEMTs; wherein the interdigitated conductors are disposed on the circuit board between the at least two columns and/or the at least two rows, for connection to anodes and cathodes of the diodes, or to drains and sources of the FETs or HEMTs.

In one embodiment of the semiconductor device matrix, the plurality of identical or similar semiconductor dies comprise GaN diodes, FETs, or HEMTs.

In one embodiment of the semiconductor device matrix, the plurality of identical or similar semiconductor dies comprise FETs or HEMTs; further comprising a gate conductor disposed on the circuit board between the interdigitated conductors, for connection to gates of the FETs or HEMTs.

In one embodiment of the semiconductor device matrix the interdigitated conductors disposed on the circuit board are tapered in width; wherein widest portions of the interdigitated conductors are at the electrical connection points. One embodiment may comprise a single circuit board. In one embodiment, the plurality of identical or similar semiconductor dies are mounted to one side of the circuit board.

In another embodiment, the plurality of identical or similar semiconductor dies are mounted to both sides of the circuit board.

In one embodiment, the semiconductor device matrix may comprise two or more circuit boards. In one embodiment, the plurality of identical or similar semiconductor dies are mounted to one side of each of the two or more circuit boards. In one embodiment, the plurality of identical or similar semiconductor dies are mounted to both sides of each of the two or more circuit boards.

In one embodiment of the semiconductor device matrix, the plurality of identical or similar semiconductor dies are flip-chip mounted or wire bond mounted on the circuit board.

In one embodiment, the semiconductor device matrix comprises a MOSFET; wherein the plurality of identical or similar semiconductor dies comprise GaN HEMTs; wherein a source of the MOSFET is connected to gates of the GaN HEMTs.

According to another aspect of the invention there is provided a method for implementing a semiconductor device, comprising: providing a die having four sides and four corners, wherein first and second corners are opposed and third and fourth corners are opposed; first and second electrodes disposed on the die at locations corresponding respectively to the first and second corners, each of the first and second electrodes having a bonding pad, a tapered base, and a plurality of electrode fingers extending from the tapered base; wherein the bonding pad of each of the first and second electrodes is located at a respective first and second corner of the die; wherein the tapered base of each of the first and second electrodes decreases in width in both directions away from its respective corner of the die; wherein the plurality of electrode fingers of the first and second electrodes are interdigitated; and a conductive channel between the interdigitated electrode fingers of the first and second electrodes.

In further embodiments, methods are provided for implementing a semiconductor device as described herein. According to the embodiments, the semiconductor device may be a GaN semiconductor device.

Another aspect of the invention relates to a GaN based semiconductor device containing one or more identical or similar semiconductor die(s) which comprises: a) a conductive channel defined by two or more electrodes on the same plane; b) two of the electrodes form interdigitated electrode finger pairs, wherein some embodiments having unequal numbers of fingers on the two electrodes; c) the shape of the die is a diamond or a square; d) the fingers are oriented towards the diagonal direction; e) shape of each finger is asymmetric with wider width near the base than near the tip; f) the base of the electrode pairs has variable width with wider width near the current injecting bonding pad; g) the current injecting bonding pads of the above interdigitated electrodes are located at two opposite corners of the diamond shaped die.

In one embodiment the device further comprises a control electrode between the interdigitated fingers to form a gate electrode of a FET.

Another aspect of the invention relates to a GaN based semiconductor device matrix, the device matrix containing multiple identical or similar semiconductor dies mounted on the surface of a circuit board such as a printed circuit board (PCB) of the following layout topology: a) the dies form a n times m two-dimensional matrix, where n and m are non-zero integers; b) the circuit connection lines for the drain and source of a GaN HEMT, or the cathode and anode of a diode, form interdigitated fingers between which a row or column of the semiconductor dies attach; c) the dies of each row or column may be merged into a single enlongated die containing multiple identical or similar isolated semiconductor devices. In various embodiments, mounting may include flip-chip mounting or wire bond mounting.

Embodiments may comprise a PCB connection line between the interdigitated fingers connecting the gates of semiconductor dies of GaN HEMT.

Embodiments may comprise a tapered PCB connection lines for the base and fingers holding the matrix of semiconductor dies. The corners of the lines can be rounded or sharp.

Embodiments may comprise a PCB with the semiconductor die matrix mounted on both sides of the same PCB.

Embodiments may comprise a PCB with the semiconductor die matrix mounted on one side of a multiple PCB stack.

Embodiments may comprise a PCB with the semiconductor die matrix mounted on both sides of every PCB forming a multiple PCB stack.

In another embodiment, a low voltage MOSFET is provided with its source connected to the gate lines of the GaN HEMT matrix to form a CASCODED E-mode device for semiconductor dies of D-mode HEMT.

Another aspect of the invention relates to a semiconductor device lattice, comprising: a semiconductor material having disposed thereon a plurality of unit cells arranged in two dimensions, each unit cell comprising a plurality of individual semiconductor devices; wherein each semiconductor device has four sides and four corners and electrodes having terminals at two or more of the corners; wherein the plurality of individual semiconductor devices of each unit cell are disposed adjacent one another such that electrical connections are provided between adjacent like terminals of the semiconductor devices; wherein the plurality of unit cells are disposed adjacent one another on the semiconductor material to form the device lattice; wherein the semiconductor material is gallium nitride.

In one embodiment, the individual semiconductor devices of each unit cell are substantially identical.

In one embodiment, the individual semiconductor devices of each unit cell are different.

In one embodiment, the unit cell is hexagonal. In one embodiment, the unit cell comprises three semiconductor devices; wherein each semiconductor device is diamond shaped and has terminals at corners of the diamond shape.

In one embodiment, the unit cell is square. In one embodiment, the unit cell comprises four semiconductor devices; wherein each semiconductor device is square and has terminals at corners of the diamond shape.

In one embodiment, each semiconductor device comprises: four sides and four corners, wherein first and second corners are opposed and third and fourth corners are opposed; first and second electrodes disposed at locations corresponding respectively to the first and second corners, each of the first and second electrodes having a tapered base, and a plurality of electrode fingers extending from the tapered base; wherein the tapered base of each of the first and second electrodes decreases in width in both directions away from its respective corner of the die; wherein the plurality of electrode fingers of the first and second electrodes are interdigitated; and a conductive channel between the interdigitated electrode fingers of the first and second electrodes.

In one embodiment, the electrode fingers of the first and second electrodes are oriented parallel to an axis defined by the first and second corners of the die.

In one embodiment, the electrode fingers are of varying length, the length of the electrode fingers decreasing along the tapered electrodes in both directions away from their respective corners of the die.

In one embodiment, each finger of the plurality of electrode fingers has a base where it extends from an electrode and a tip, and each finger is wider at the base than at the tip. In one embodiment, finger tips of the plurality of electrode fingers have a circular or oval shape. In one embodiment, finger tips of the plurality of electrode fingers have a rounded shape defined by a power function, wherein the power is two or greater.

In one embodiment, the individual semiconductor devices are diodes, FETs, or HEMTs, or any combination thereof.

Another aspect of the invention relates to a method for implementing a semiconductor device lattice as described herein.

Another aspect of the invention relates to a GaN based field effect transistor comprising: a) electrodes and metal pads forming a Bravais lattice in two dimensions; b) building block being a diamond shaped chip with metal pads at four corners; c) unit cell of the Bravais lattice being constructed from rotating multiple times with the diamond around one of the corner metal pads.

One embodiment further comprises a building block having interdigitated electrode fingers with its base size varying from large to small as it runs from the metal pads at the drain and source to the fingers.

One embodiment further comprises a building block having interdigitated electrode fingers of asymmetric shape and with size larger near the base.

One embodiment further comprises a building block having interdigitated electrode fingers having finger tips of rounded, circular, or oval shape.

One embodiment further comprises a building block having interdigitated electrode fingers, the finger tips having a rounded shape defined by a power function of power no less than two.

BRIEF DESCRIPTION OF THE DRAWINGS

To better understand the invention, and to show more clearly how it may be carried into effect, embodiments will be described, by way of example, with reference to the accompanying drawings, wherein.

DETAILED DESCRIPTION

Overview

Figure 1:
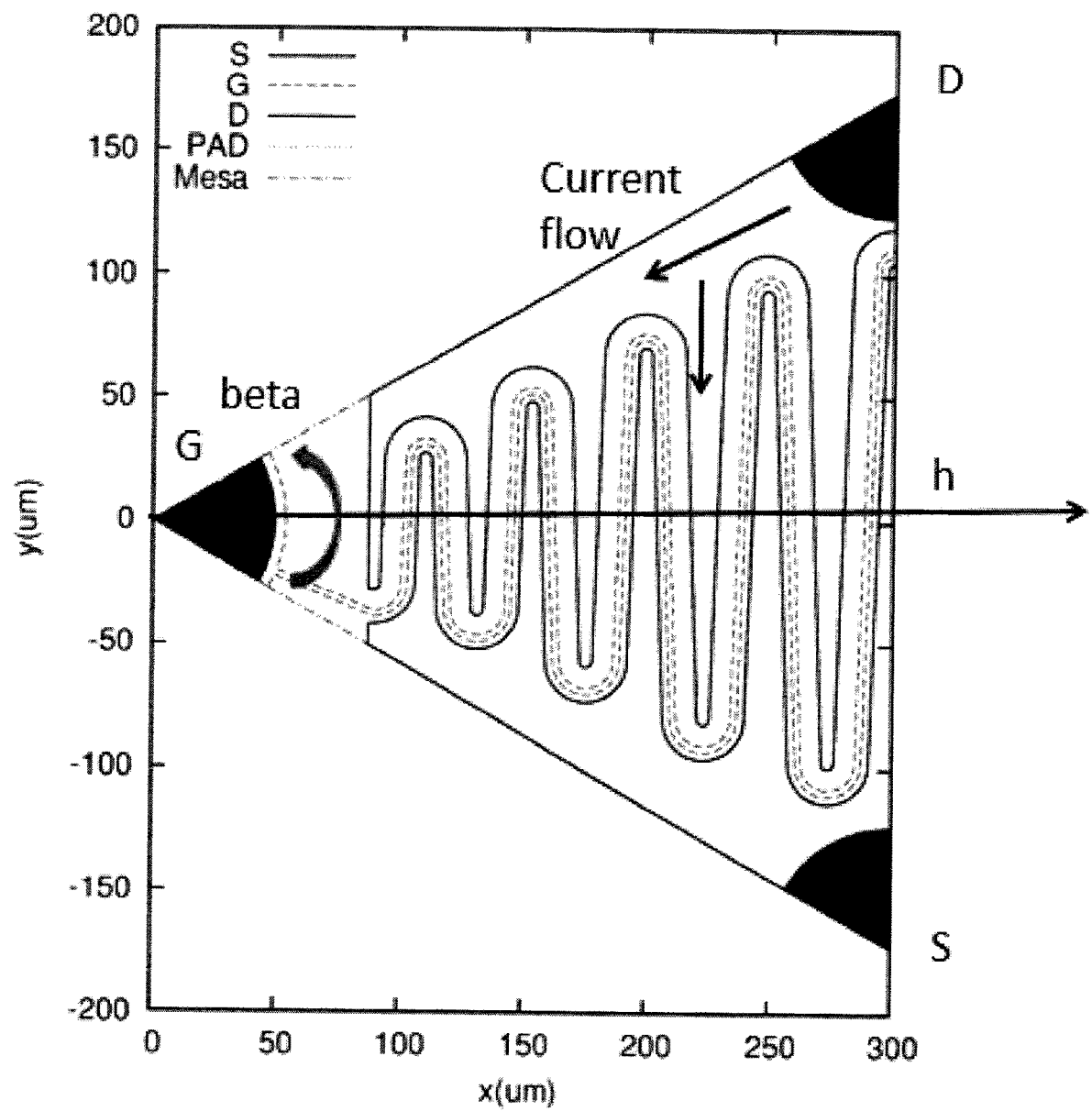
FIG. 1 is a diagram showing a triangular semiconductor device layout, wherein D, S, and G refer to drain, source, and gate, respectively, according to an embodiment of the invention.

Described herein are gallium nitride (GaN) semiconductor devices and structures. Embodiments include devices such as diodes, FETs, and HEMTs at the semiconductor wafer die layout level, as well as structures based on multiple dies at the printed circuit board (PCB) level for applications such as flip-chip packaging.

Embodiments described herein improve the heat dissipation over that of prior designs by using multiple semiconductor dies on the PCB when packaging GaN devices, and by a device layout that employs a variable base (i.e., electrode) width, interdigitated electrode fingers, and electrode terminals at corners of the device. Device dies may be of a diamond shape or of a square shape to achieve better thermal management. GaN devices described herein are lateral devices, the layout of which presents design challenges when thermal performance (i.e., heat dissipation) must be considered, particularly in high power applications. The above-mentioned features improve heat dissipation while addressing design constraints in lateral GaN devices.

At the semiconductor wafer design level, embodiments described herein feature a layout that places the wire bond pads of gate, drain, and source terminals of a HEMT or FET, or those of cathode and anode terminals of a diode, on corners of a diamond shaped semiconductor die. Alternatively, the die shape may be a square for ease of laser cutting from a semiconductor wafer.

The electrode fingers, which may be asymmetrical, are oriented with their long axes in the diagonal direction of the die. The tapered electrode base and fingers uniformly spread the current injected from the bond pad at the corner of the die towards the fingers. The bond pads for the gate terminal are located on the other pair of opposed corners of the diamond or square die.

Device structures described herein include embodiments wherein multiple individual device dies are arranged on a substrate (i.e., circuit board, or printed circuit board ("PCB")). At the PCB level, a simple one-level layout is used to connect individual semiconductor device dies into a two-dimensional matrix. The matrix consists of n rows and m columns where n and m are integers.

The matrix is connected by pairs of interdigitated electrodes on the PCB of the flip-chip package. Flip-chip bonding may be used on metal or ceramic based PCB for better heat extraction from the semiconductor dies which are expected to sustain high current in high power applications. The PCB space between active semiconductor dies may be used either as heat dissipation area or as highly conductive metal lines, in the case of metal PCB.

The two-dimensional matrix on one side of the PCB may be extended to both sides of the same PCB or to a stack of multiple PCBs to construct a three-dimensional layout topology.

Another aspect of the invention relates to a semiconductor device with a layout topology (i.e., a structure) that increases or maximizes power density of a chip. The chip may be packaged using a flip-chip method on a metal or ceramic PCB. Although the embodiments are applicable to any semiconductor material/device, they are particularly suitable for GaN devices such as FETs and HEMTs because of the superior heat dissipation characteristics provided.

Using a variable electrode base width and interdigitated electrode finger geometry, a triangle shaped basic element may be constructed with two opposite corners being the source (S) and drain (D) electrodes metal pads. The interdigitated fingers are aligned along the direction of a D-S axis, and the interdigitated fingers may be implemented with asymmetric finger shapes.

The triangle shaped basic element can be unfolded or mirrored about the D-S axis to form a diamond shape which then can be rotated and copied to form a unit cell of a Bravais lattice. Discrete translation of the unit cell forms a crystal lattice which may be realized in any size, thus making possible large sizes to handle large current and power.

It is demonstrated herein via numerical simulation that a hexagonal lattice has better heat dissipation than a rectangular or square lattice given the same pad to pad distance.

Device Design

One aspect of the invention relates to a semiconductor device. The embodiment of FIG. 1 shows a triangular device layout which may be considered as a basic design element. In FIG. 1, as well as other figures (e.g., FIGS. 2, 3, 7-14), axes shown with dimensions in μm are exemplary, as other dimensions may be used. The gate, drain, and source terminals are shown at G, D, and S, respectively. The angle beta may be varied to construct different sizes/shapes of unit cells of the repeating layout topology. The vertical line or axis connecting D and S may be used as a symmetric unfolding or mirroring axis. For example, in one embodiment a hexagonal unit cell topology (FIG. 7, described below) is achieved for a beta angle of 60 degrees. When the beta angle is 90 degrees, a square lattice can be constructed (e.g., FIG. 3). Other beta angles may be used, resulting in corresponding shapes of unit cells. FIG. 1 also shows the direction of current flow in the drain electrode (diagonal arrow) and in a representative interdigitated drain electrode finger (downward arrow).

Figure 2:
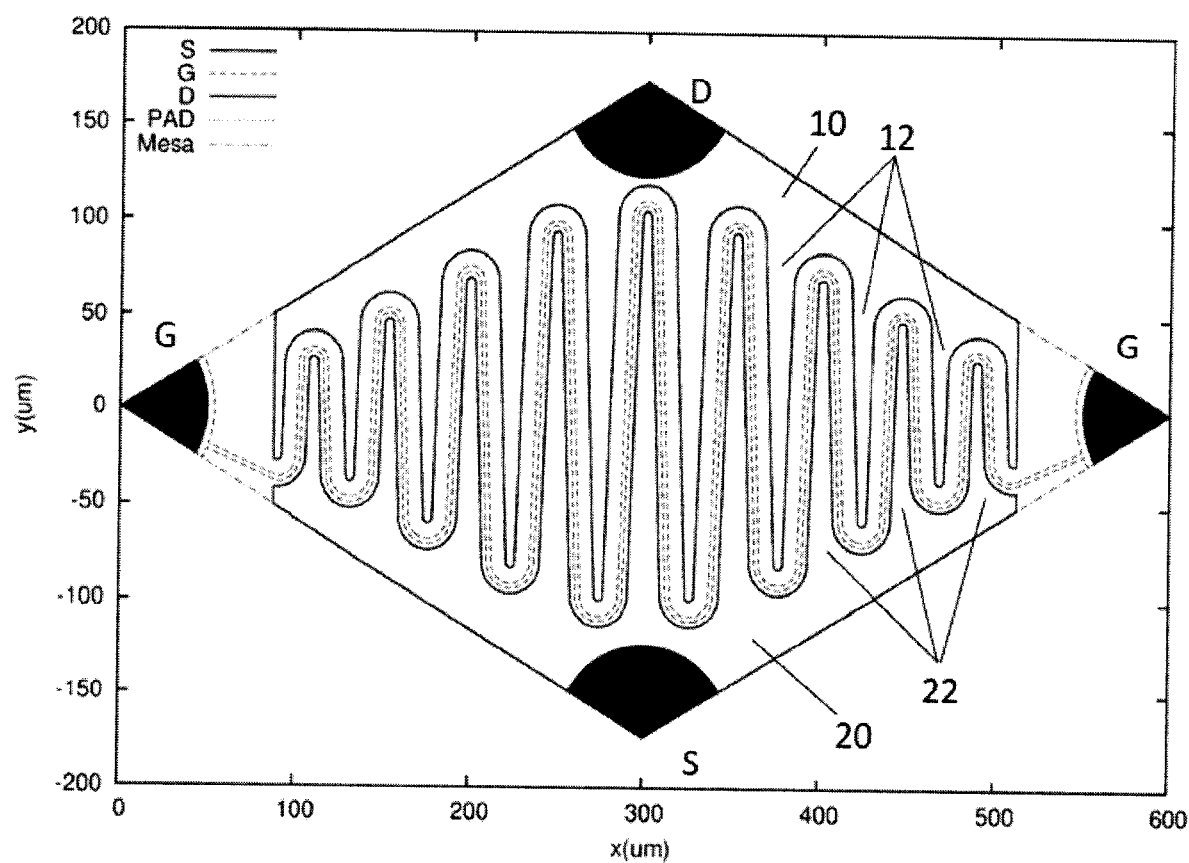
FIG. 2 is a diagram showing symmetrical unfolding of the triangular device layout of FIG. 1 about an axis from D to S, to form a diamond-shaped device layout, according to one embodiment.
Figure 3:
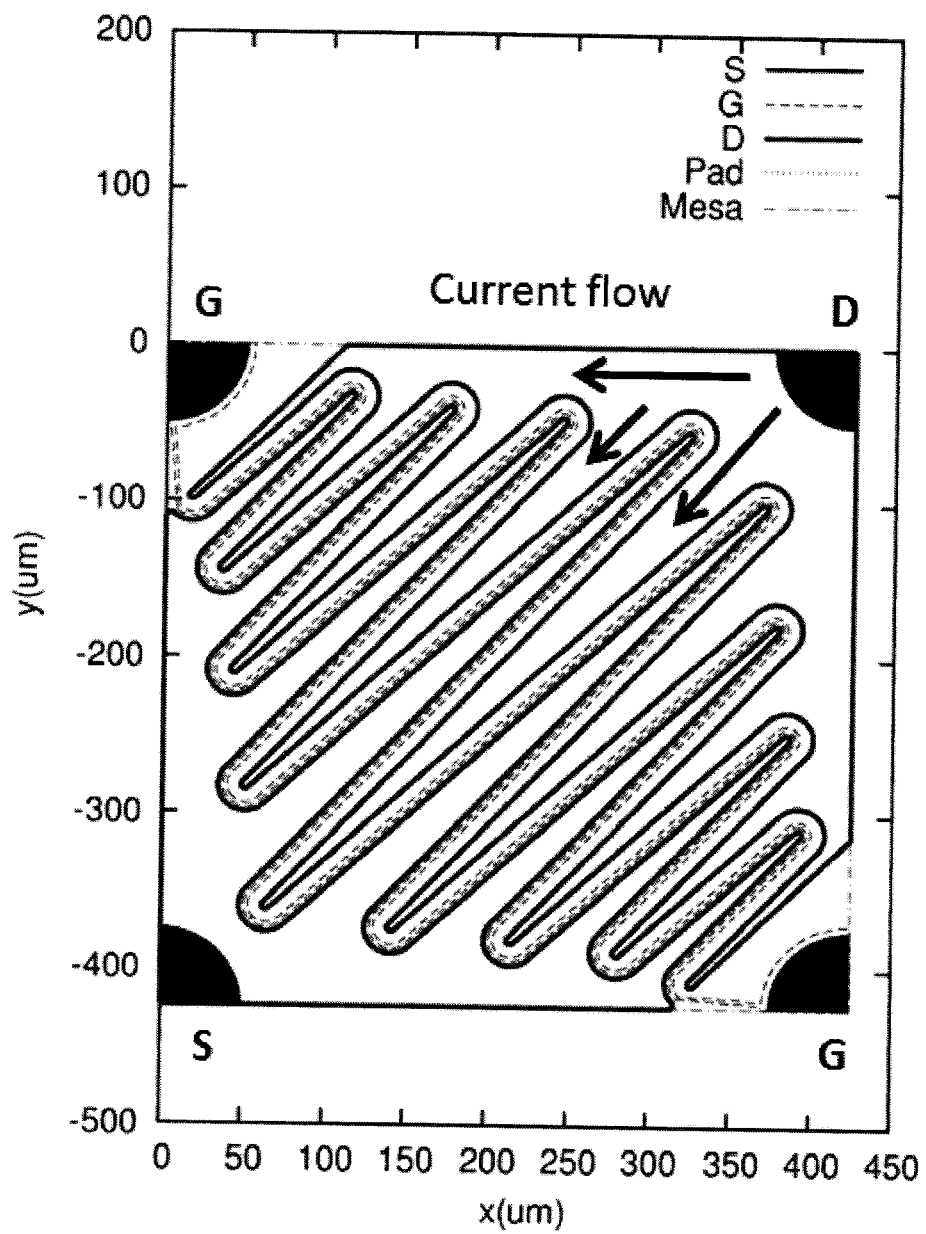
FIG. 3 is a diagram showing a square device layout, according to one embodiment.

For example, FIG. 2 shows a diamond shaped device layout achieved by symmetric unfolding or mirroring of the basic triangle of the embodiment of FIG. 1 along the axis D-S. As another example, FIG. 3 shows a square shaped device layout achieved by symmetric unfolding or mirroring of a basic triangle embodiment where the beta angle is 90 degrees. As noted, a square or rectangular device layout may be preferred because it is easy to dice from a wafer.

Features of semiconductor device layouts are evident from the embodiments of FIGS. 2 and 3. For example, the drain, source, and gate electrode terminals are disposed on corners of the die. Referring to FIG. 2, each of the drain and source electrodes has a base 10, 20, respectively, and a plurality of interdigitated electrode fingers 12, 22, respectively, extending from the base. In some embodiments, such as those shown in FIGS. 2 and 3, the interdigitated fingers are tapered, becoming narrower toward the tips of the fingers. The bases 10 and 20 of the drain and source electrodes are tapered and become narrower in both directions away from their respective corners. That is, the electrodes become narrower in the direction of current flow (indicated in FIG. 1), which minimizes the total resistance of device and improves thermal performance. Similarly, tapered interdigitated electrode fingers further lowers overall resistance of the device and improves thermal performance. The gate terminals are connected to a conductive channel between the interdigitated electrode fingers of the drain and source electrodes. Bonding pads for each terminal are disposed on the electrodes at locations substantially corresponding to the corners of the die.

The interdigitated fingers are of variable length, the length varying (decreasing) as distance in both directions away from the drain or source terminal corner increases.

In the variable base width layout topology of the embodiments described herein, the interdigitated fingers are oriented by an angle (e.g., 45 degrees) from the edge (or mesa edge) of the semiconductor die. This allows the placement of bond pads at the corners of the die while maximizing the gate width or cathode/anode interface per wafer area.

Device Matrix

Figure 4:
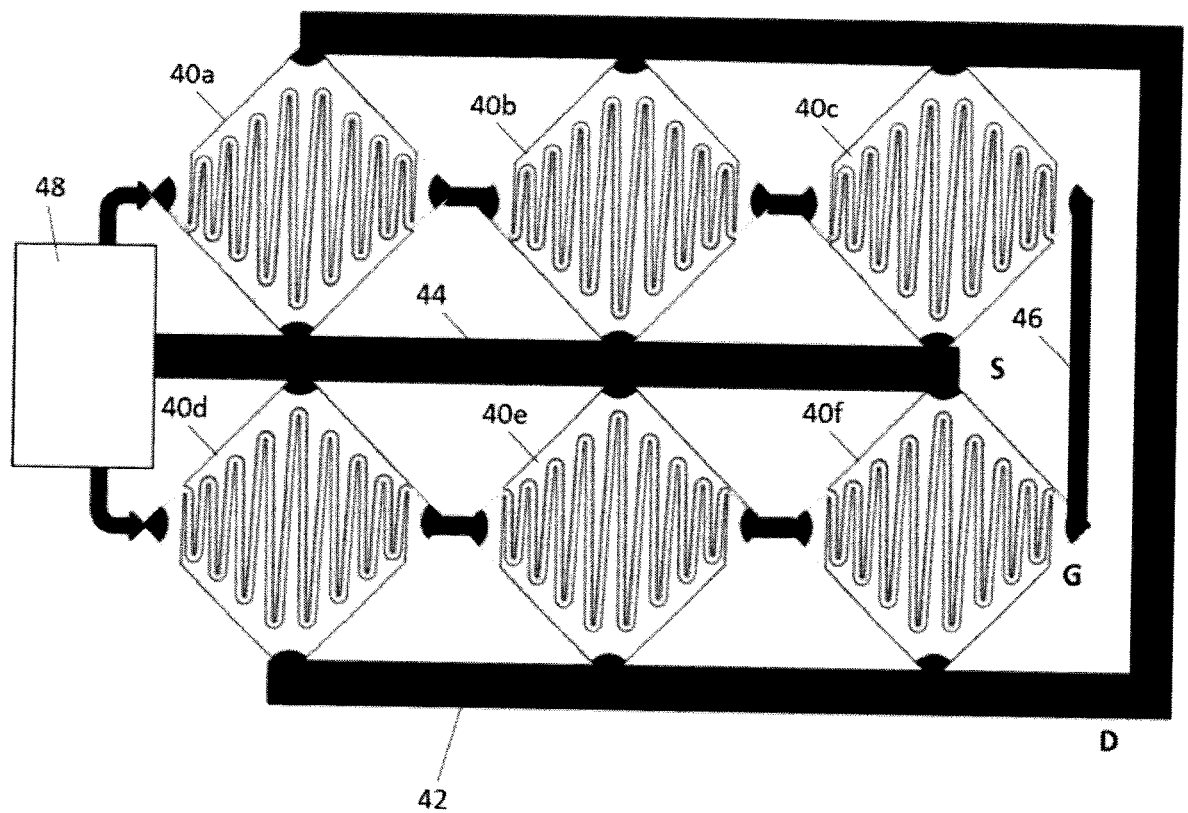
FIG. 4 is a diagram showing a packaged device using multiple bare dies of identical or similar design parameters to form a semiconductor matrix on a PCB, optionally with the gate electrodes of the matrix connected to the source electrode of a low voltage MOSFET to form a cascoded enhance mode GaN HEMT, according to an embodiment described herein.

According to another aspect of the invention, a semiconductor device matrix is provided. Embodiments of the semiconductor device matrix may be implemented using a plurality of semiconductor device dies as described above, e.g., with diamond, rectangular, or square shaped die layouts. An example is shown in FIG. 4. In this embodiment the matrix is constructed from multiple (six) bare dies 40*a*-40*f* arranged in n rows×m columns=2×3 that are mounted (e.g., flip-chip (FC) or wire bonded) to metal conductors for the drain 42, source 44, and gate 46 of a substrate, i.e., circuit board, such as a PCB. This reduces the total resistance of delivering electrical power to the GaN die active area and improves heat dissipation. A multiple die matrix configuration also uniformly spreads the heat generated in the semiconductor dies to the metal based PCB, therefore enabling very large current rating in the packaged device matrix without issues of overheating. The PCB metal layout lines 42, 44, 46 have a large width for high current handling and better heat dissipation. The interdigitated conductors on the circuit board may have rounded corners, to minimize corner effects. As shown in FIG. 4, drain 42 and source 44 conductors are disposed on the circuit board as interdigitated conductors, for connection to the drains and sources, or anodes and cathodes, of the device dies. At least one electrical connection point is associated with each of the conductors. In general, for the matrix, the sizes of the conductors decrease from PCB wiring to bond pad to base and finally to the device fingers.

A split die matrix arrangement such as the embodiment shown in FIG. 4 also has an important advantage of flexible thermal management on PCB in the situation of high current. By adjusting the die to die distance in the matrix on PCB, different current ratings can be tolerated by the same wafer design.

In a flip-chip package on a metal based PCB, the main path of heat dissipation is through the metal solder of the bonding pads at the corners of the bare die.

In a high power switching design, it may be necessary to arrange the bare dies wider apart so that a wider area of the metal substrate can be used to dissipate the high heat.

Figure 5:
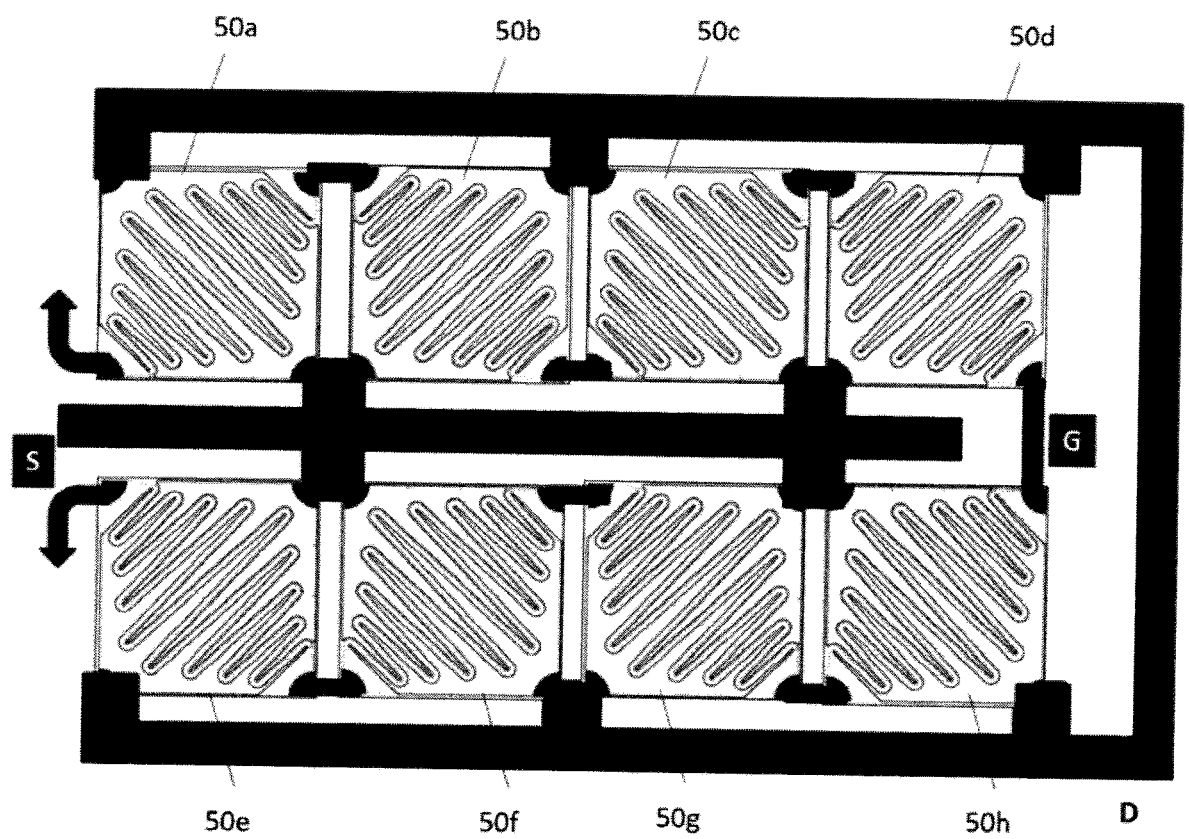
FIG. 5 is a diagram of a semiconductor device matrix topology with high current density, according to an embodiment.

The n×m 2D matrix arrangement can have different orientations for the bare dies. The orientation in FIG. 4 has the advantage of shortest die to die distance. A different orientation can be used to separate the pad to pad distance for better control of heat source distribution. For example, the 2×4 matrix embodiment in FIG. 5 with eight GaN dies 50a-50h has higher power density per area and trades off the active die spacing for better metal interconnection conduction. In one embodiment the matrix is configured with only a single row or column (i.e., n or m=1) of a plurality of similar or identical semiconductor devices.

Since HEMT bare dies are depletion mode devices, a low voltage MOSFET 48 can optionally be CASCODE connected to the HEMTs with its source connected to the gates of the HEMTs (see, e.g., FIG. 4), to form a CASCODED E-mode device matrix with semiconductor dies of D-mode HEMTs.

Figure 6:
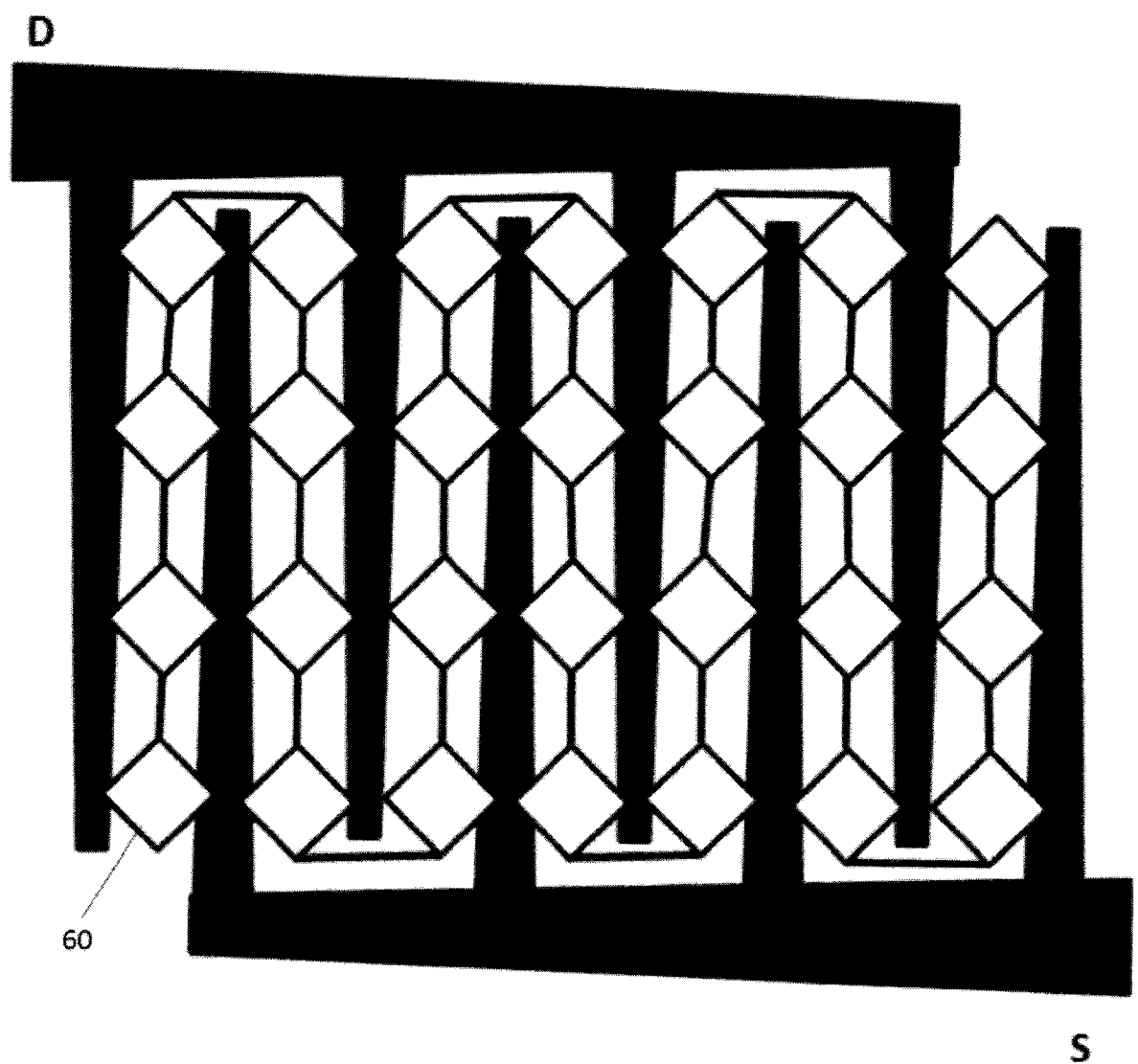
FIG. 6 is a diagram of a semiconductor device matrix topology using tapered interdigitated fingers for the drain and source conductors at the PCB layout level, according to one embodiment.

The interdigitated PCB conductor layout can have a tapered width to reduce the total resistance of the packaged device, as illustrated in the embodiment in FIG. 6. This embodiment has 28 square device dies (e.g., one is indicated at 60) arranged in a 4×7 matrix. Electrical connection points to the matrix are preferably at the widest points of the conductors, e.g., at the D and S ends as shown in FIG. 6. The tapered interdigitated PCB conductors on one side of the PCB can be connected by metal wiring to a similar implementation of the 2D layout on the opposite side of the same PCB, or a stack of multiple 2D layout PCBs, or a combination of both.

Device Lattice

According to another aspect of the invention, a lateral GaN device lattice is provided. Embodiments of the device lattice may be implemented using a device layout as described above, e.g., with diamond, rectangular, or square shaped layouts.

Figure 7:
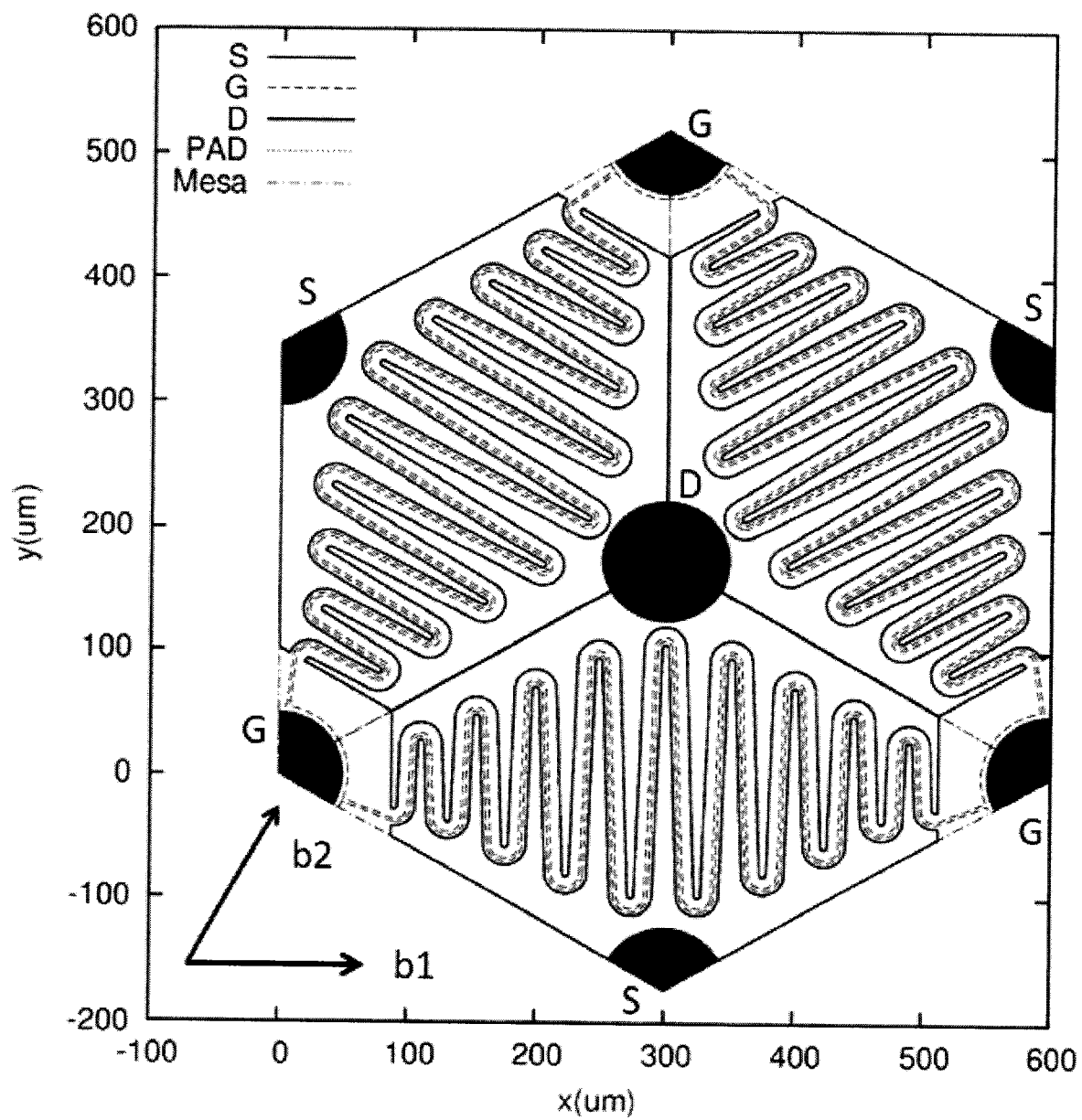
FIG. 7 is a diagram showing a unit cell of a Bravais lattice constructed from rotating 120 degrees and repeating the diamond shape device layout of FIG. 2 around point D (the drain metal pad) two times, such that the unit cell has three devices oriented at 120 degrees apart, according to one embodiment.

In one embodiment, a diamond shaped device layout such as that shown in FIG. 2 is rotated and copied/pasted around point D (i.e., the drain terminal) to form a basic Bravais lattice cell, as shown in FIG. 7. In this embodiment, the diamond shape has a beta angle of 60 degrees. Rotation of 120 degrees two times forms a complete Bravais lattice unit cell, in this embodiment a hexagon. Primitive vectors b1 and b2 of the Bravais cell are indicated.

For the embodiment of hexagonal lattice, the primitive vectors b1 and b2 can be expressed in vector form as:

$$b1=(2h,0)$$

$$b2=(2h*\cos(beta),2h*\sin(beta))$$

where angle beta is 60 degrees for this embodiment.

As defined by a Bravais lattice, repetition of the primitive vector using integers n1 and n2 can lead to the construction of a lattice:

$$b=n1*b1+n2*b2$$

where n1 and n2 are integers and vector b points to any lattice cell.

Figure 8:
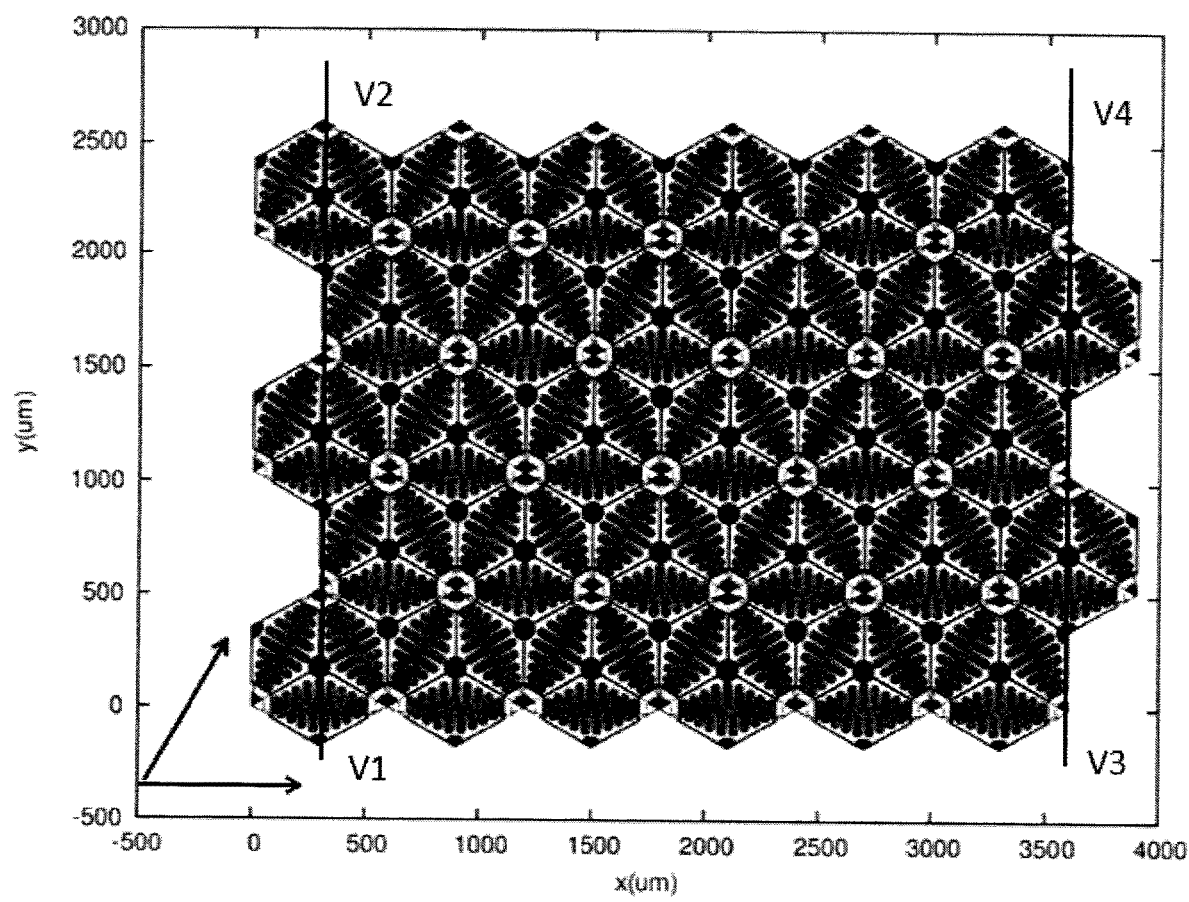
FIG. 8 is a diagram showing an embodiment of a crystal lattice layout topology obtained by discrete translation of the primitive vectors b1 and b2 by five and four times, respectively.

Running the integers n1 from 1 to 5 and n2 from 1 to 4 generates the lattice shown in FIG. 8. The above formulas may be used to scale the device to accommodate any power or current rating on the same wafer within the same tape out. The current rating or power rating of a unit cell or a single device is proportional to the area of the unit cell or device. The current or power rating may be dependent upon the specific processing technology used as well as on the details of the interdigitated finger electrode design. However, it will be appreciated that in providing a device lattice as according to embodiments described herein, current/power rating of GaN devices can be maximized for a given wafer area due to the efficient use of wafer real estate and the device features which improve power handling and heat dissipation. Further, once the current/power handling capability of a single device or cell has been determined, the design can be scaled up substantially without limitation due to the periodicity of the embodiments.

It is noted that for a hexagonal lattice, the boundary is not automatically straight, making it challenging to perform laser dicing. One strategy is to dice along lines V1V2 and V3V4 (FIG. 8). If the pad to pad spacing is small, the zigzag on top and bottom may be tolerable and does not cause any significant waste of wafer real estate.

Figure 9:
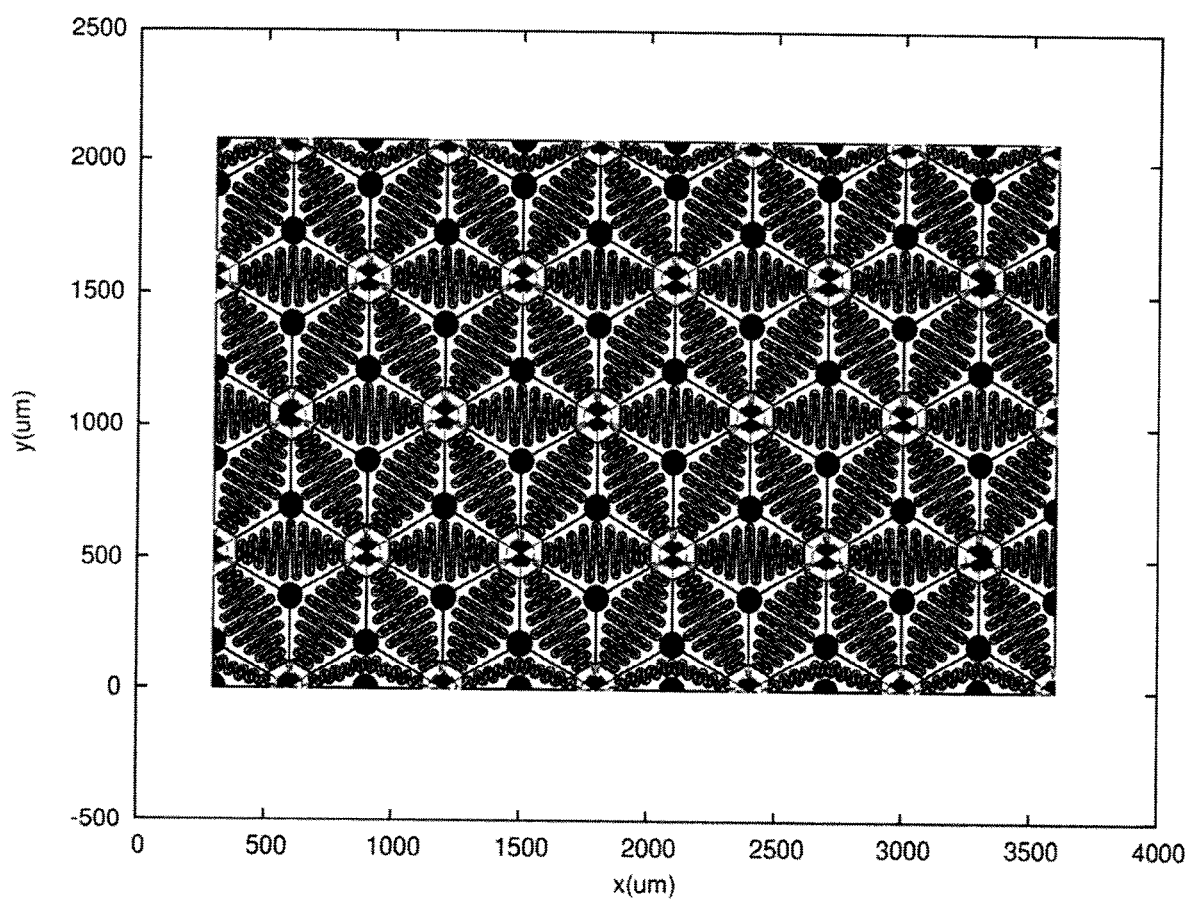
FIG. 9 is a diagram showing an embodiment similar to that of FIG. 8, but with a boundary cell design that forms straight streets between bare dies convenient for laser dicing.

However, if the pad to pad spacing is relatively large, the unfilled space in the zigzag above and below can be a significant waste. In such a case, it is beneficial to construct shape-modified triangular cells to fill up the unused spaces, as shown in FIG. 9. The boundary triangular cell is designed to form straight streets between bare dies, which is convenient for laser dicing. Such embodiments maximize usage of the wafer real estate.

Figure 10:
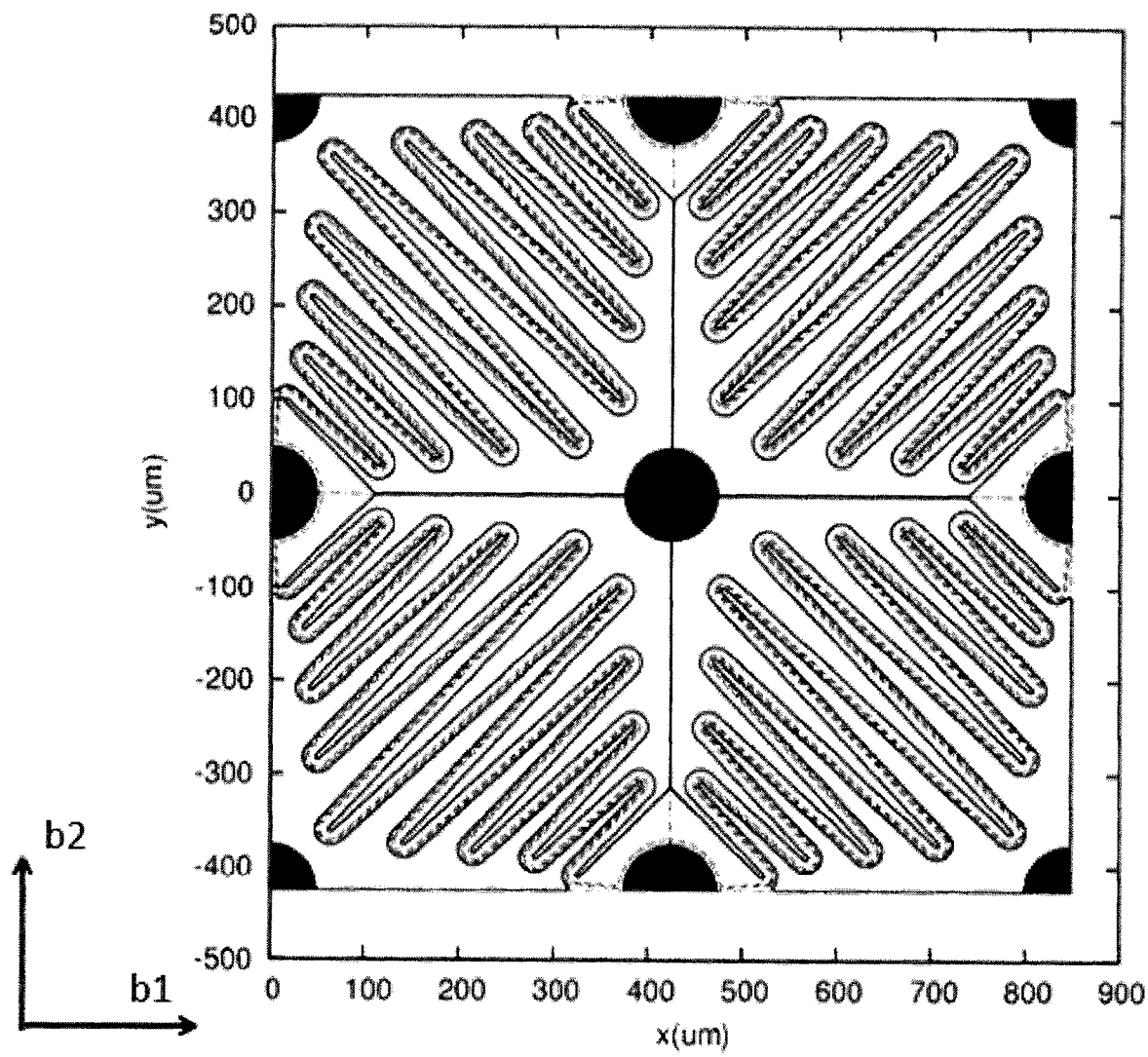
FIG. 10 is a diagram showing another embodiment of a unit cell for a device lattice layout based on a rectangular or square device layout.
Figure 11:
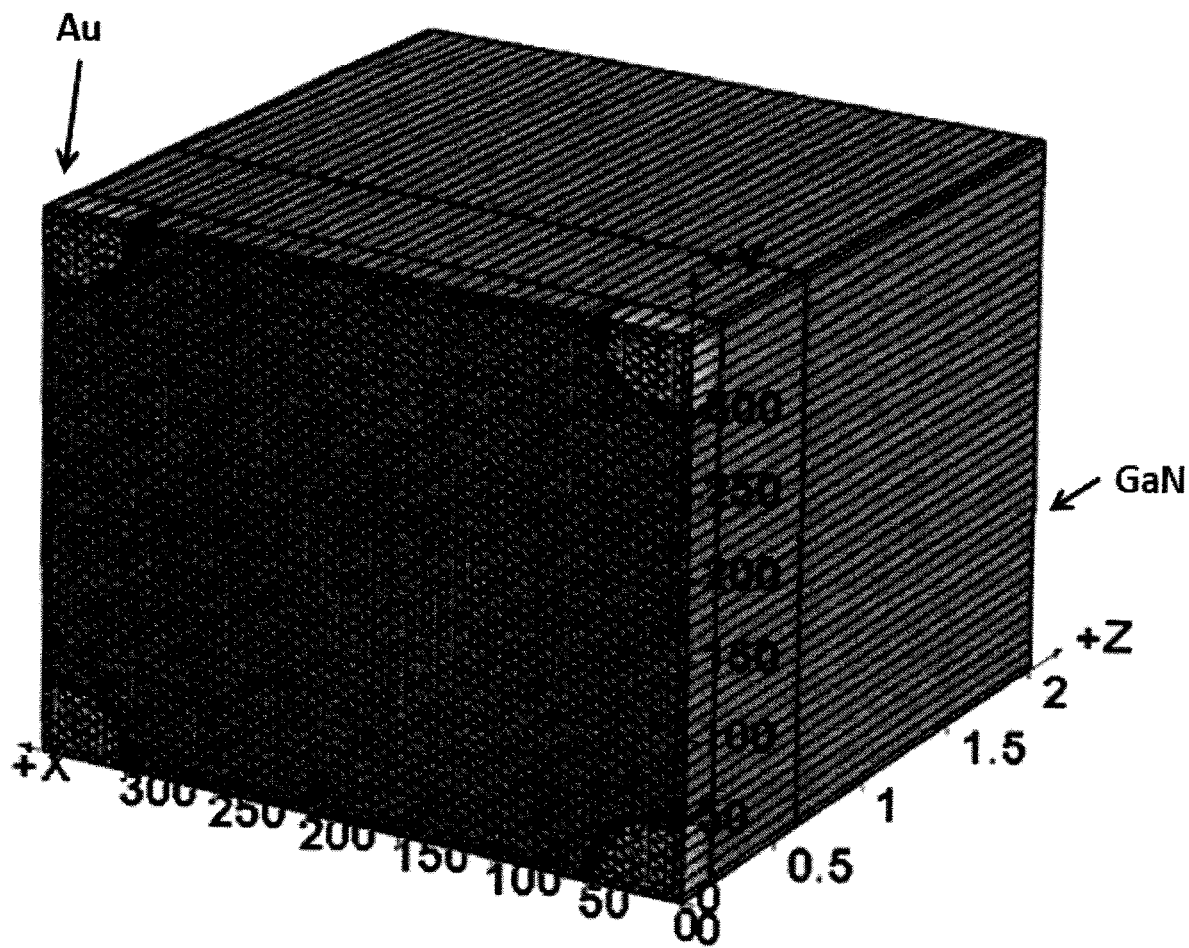
FIG. 11 is a diagram showing a 3D structure of a GaN device lattice based on a square unit cell such as that of FIG. 10, used in a simulation of device cooling.

In another embodiment, setting the beta angle to 90 degrees and unfolding along the D-S axis results in a rectangle or square die (FIG. 3). Repeating the rectangle or square forms a rectangular or square Bravais lattice, as shown in FIG. 10. An advantage of a square lattice is straight termination at the boundary for laser dicing. However, as will be shown below, given the same pad to pad distance, a square lattice is not optimal for heat dissipation or cooling.

Thus, in one embodiment the unit cells of the device lattice comprise a plurality of substantially identical GaN devices such as diodes, FETs, or HEMTs connected in parallel, such as the unit cell of FIG. 7, the unit cells being arranged in a repeating or lattice structure (i.e., with geometrical periodicity) on a single chip. In another embodiment, each unit cell of the device lattice may include two or more different device types. For example, a unit cell may include a diode and one or more FET or HEMT, and the device lattice would be implemented with a plurality of such unit cells, thus maintaining geometrical periodicity of the lattice layout. In a further embodiment, a device lattice may be implemented using two or more different unit cells, wherein the two or more different unit cells are repeated together to construct the device lattice.

Device lattice embodiments may be mounted on a suitable substrate such as a metal/ceramic PCB, using a technique such as land grid array (LGA) packaging, flip-chip mounting, or surface mount technology and thereby establish connections to the drain, source, and gate terminals. Conventional wire bonding may also be used in embodiments or designs based on a smaller lattice size (i.e., fewer unit cells), to avoid excessively long bond wires.

Figure 12:
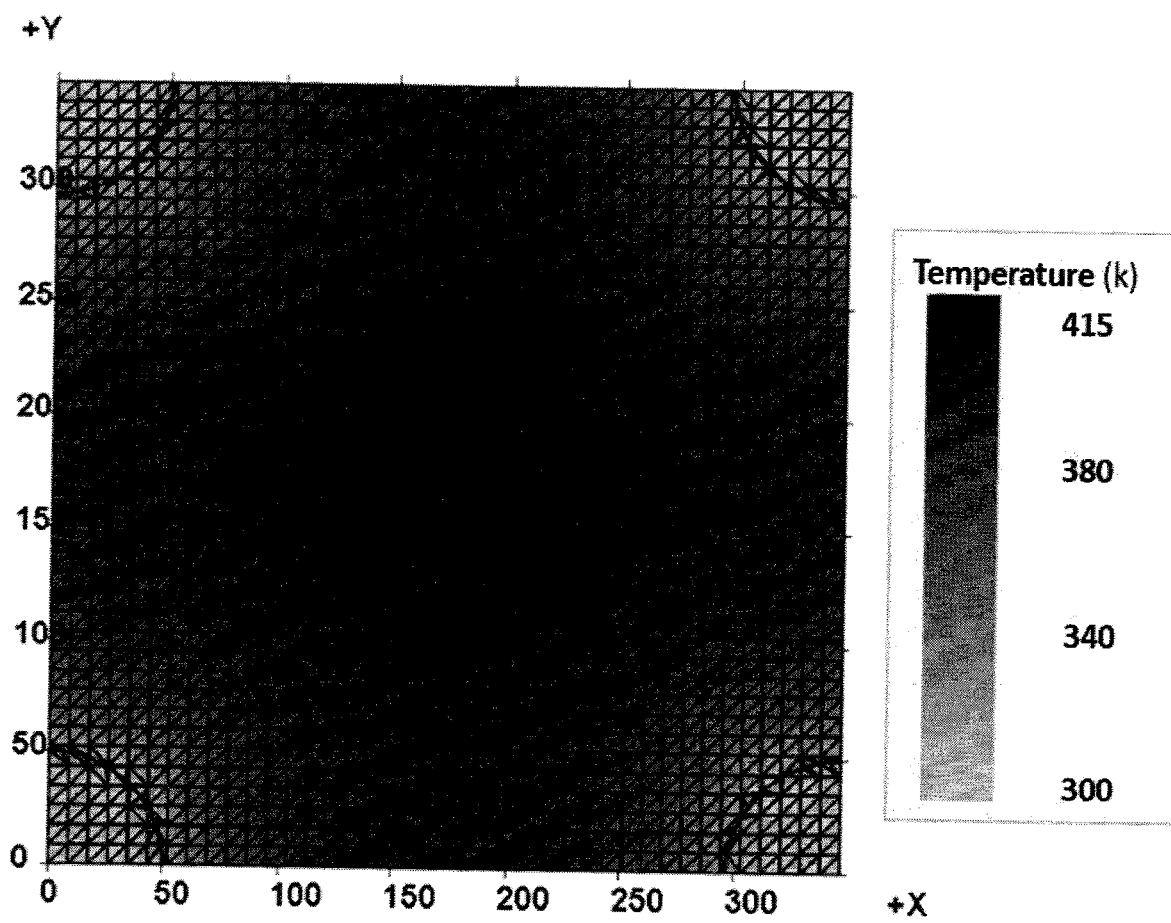
FIG. 12 is a diagram showing results of the simulated temperature distribution across the square device lattice of FIG. 11.
Figure 13:
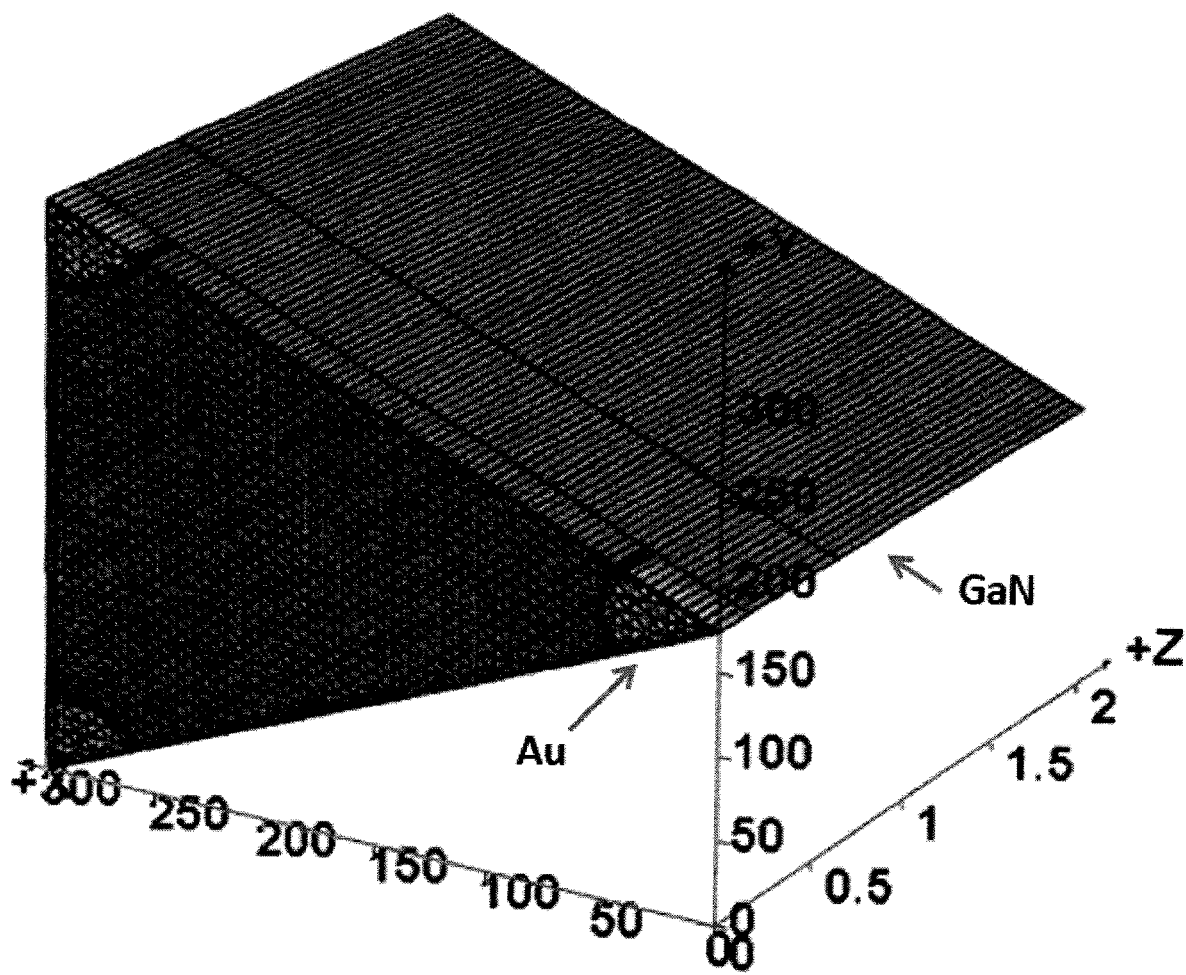
FIG. 13 is a diagram showing a 3D structure of a device lattice based on a hexagonal unit cell such as that of FIG. 7, used in a simulation of device cooling.
Figure 14:
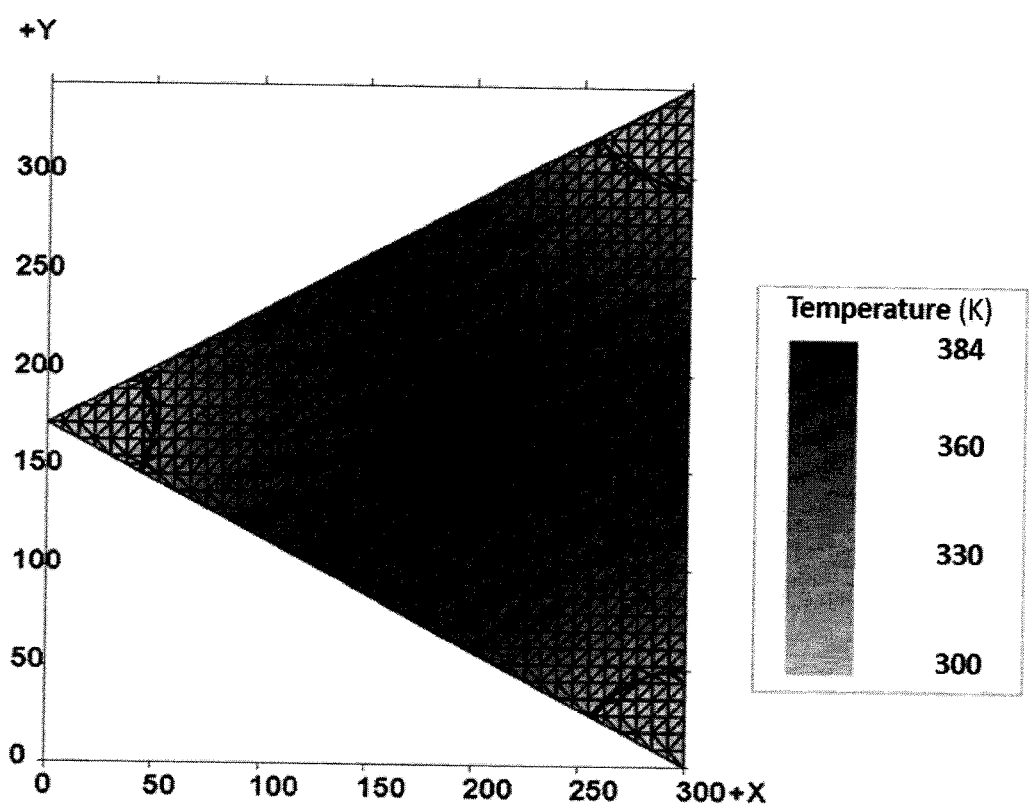
FIG. 14 is a diagram showing results of the simulated temperature distribution across the hexagonal device lattice of FIG. 13.

To demonstrate the importance of lattice type (e.g., hexagonal, square) to cooling of the device (e.g., FET) at high power density, two lattice types were compared in a simulation of device cooling using APSYS™ advanced semiconductor simulation software, available from Crosslight Software Inc., Vancouver, Canada (https://crosslight.com). A 3D structure of a square lattice layout (FIG. 11) was used as a reference to compare with an embodiment of a 3D structure of a hexagonal lattice layout (FIG. 13). In these figures, the device lattice is shown in the x-y direction and the wafer thickness in the z direction. In the simulation it was assumed that the chip is flip-chip mounted on a metal/ceramic PCB and the metal pads were idealized by a heat sink of 300K. The temperature distributions for the square and hexagonal lattices are shown in FIGS. 12 and 14, respectively. For the same pad to pad distance and the same power density per square, the temperature rise is substantially higher for the square lattice (FIG. 12) than for the hexagonal lattice (FIG. 14).

The simulation is a strong indication of the effectiveness of the cooling by the hexagonal lattice topology.

It is noted that solder pads on PCB are easy to implement for both hexagonal and square lattice arrangements and can be conveniently scaled to any power or current rating within the same wafer.

EQUIVALENTS

Those skilled in the art will recognize or be able to ascertain variants of the embodiments described herein. Such variants are within the scope of the invention and are covered by the appended claims.

The invention claimed is:

1. A semiconductor device lattice, comprising:
a semiconductor material having disposed thereon a plurality of unit cells arranged in two dimensions, each unit cell comprising a plurality of individual semiconductor devices;
wherein each semiconductor device has four sides and four corners and electrodes having terminals at the corners, including first and second electrodes disposed at respective first and second opposed corners, each of the first and second electrodes having a tapered base and a plurality of tapered electrode fingers extending from the tapered base;
wherein the plurality of tapered electrode fingers of the first and second electrodes are interdigitated and oriented parallel to an axis defined by the first and second corners, and a conductive channel is provided between the interdigitated tapered electrode fingers;
wherein the plurality of individual semiconductor devices of each unit cell are disposed adjacent one another such that electrical connections are provided between adjacent like terminals of the semiconductor devices;
wherein the plurality of unit cells are disposed adjacent one another on the semiconductor material to form the device lattice;
wherein the semiconductor material is gallium nitride.

2. The semiconductor device lattice of claim 1, wherein the individual semiconductor devices of each unit cell are substantially identical.

3. The semiconductor device lattice of claim 1, wherein the individual semiconductor devices of each unit cell are different.

4. The semiconductor device lattice of claim 1, wherein each unit cell is hexagonal.

5. The semiconductor device lattice of claim 4, wherein the unit cell comprises three semiconductor devices;
wherein each semiconductor device is diamond shaped and has terminals at corners of the diamond shape.

6. The semiconductor device lattice of claim 1, wherein the unit cell is square.

7. The semiconductor device lattice of claim 6, wherein the unit cell comprises four semiconductor devices;
wherein each semiconductor device is square and has terminals at corners of the square.

8. The semiconductor device lattice of claim 1, wherein each semiconductor device comprises:
four sides and four corners, wherein the first and second corners are opposed and third and fourth corners are opposed;
wherein each of the first and second electrodes disposed respectively at the first and second corners has a tapered base, and a plurality of electrode fingers extending from the tapered base;
wherein the tapered base of each of the first and second electrodes decreases in width in both directions away from its respective corner.

9. The semiconductor device lattice of claim 8, wherein the electrode fingers are of varying length, the length of the electrode fingers decreasing along the tapered electrodes in both directions away from their respective corners.

10. The semiconductor device lattice of claim 8, wherein each finger of the plurality of electrode fingers has a base where it extends from an electrode and a tip, and each finger is wider at the base than at the tip.

11. The semiconductor device lattice of claim 10, wherein finger tips of the plurality of electrode fingers have a circular or oval shape.

12. The semiconductor device lattice of claim 10, wherein finger tips of the plurality of electrode fingers have a rounded shape defined by a power function, wherein the power is two or greater.

13. The semiconductor device lattice of claim 1, wherein the individual semiconductor devices are diodes, FETs, or HEMTs, or any combination thereof.

14. A method for implementing a semiconductor device lattice, wherein the method includes:
disposing on a semiconductor material a plurality of unit cells arranged in two dimensions, each unit cell comprising a plurality of individual semiconductor devices;
wherein each semiconductor device has four sides and four corners and electrodes having terminals at two or more of the corners, including first and second electrodes disposed at respective first and second opposed corners, each of the first and second electrodes having a tapered base and a plurality of tapered electrode fingers extending from the tapered base;
wherein the plurality of tapered electrode fingers of the first and second electrodes are interdigitated and oriented parallel to an axis defined by the first and second corners, and a conductive channel is provided between the interdigitated tapered electrode fingers;
disposing the plurality of individual semiconductor devices of each unit cell adjacent one another such that electrical connections are provided between adjacent like terminals of the semiconductor devices;
wherein the plurality of unit cells are disposed adjacent one another on the semiconductor material to form the device lattice;
wherein the semiconductor material is gallium nitride.

15. The method of claim 14, comprising disposing each semiconductor device such that each semiconductor device has four sides and four corners, wherein first and second corners are opposed and third and fourth corners are opposed;

arranging the first and second electrodes at respective first and second corners, each of the first and second electrodes having a tapered base, and a plurality of electrode fingers extending from the tapered base;

wherein the tapered base of each of the first and second electrodes decreases in width in both directions away from its respective corner.

16. The method of claim 14, comprising arranging the four sides and four corners of each semiconductor device such that the unit cell is hexagonal.

17. The method of claim 16, comprising disposing three semiconductor devices in each unit cell;

wherein each semiconductor device is diamond shaped and has terminals at corners of the diamond shape.

18. The method of claim 14, comprising arranging the four sides and four corners of each semiconductor device such that the unit cell is square.

19. The method of claim 18, comprising disposing four semiconductor devices in each unit cell;

wherein each semiconductor device is square and has terminals at corners of the square.

* * * * *